United States Patent
Chan et al.

[11] Patent Number: 6,140,237
[45] Date of Patent: Oct. 31, 2000

[54] DAMASCENE PROCESS FOR FORMING COPLANAR TOP SURFACE OF COPPER CONNECTOR ISOLATED BY BARRIER LAYERS IN AN INSULATING LAYER

[75] Inventors: Lap Chan, SF, Calif.; Jia Zhen Zheng, Singapore, Singapore

[73] Assignee: Chartered Semiconductor Manufacturing Ltd., Singapore, Singapore

[21] Appl. No.: 09/294,048

[22] Filed: Apr. 19, 1999

Related U.S. Application Data

[63] Continuation of application No. 08/876,915, Jun. 16, 1997, Pat. No. 5,900,672.

[51] Int. Cl.$^7$ ............................................. H01L 21/44
[52] U.S. Cl. ........................... 438/687; 438/637; 438/653
[58] Field of Search ......................... 438/633, 687, 438/637, 653, 672, 678, 688

[56] References Cited

U.S. PATENT DOCUMENTS

| | | | |
|---|---|---|---|
| 4,910,169 | 3/1990 | Hoshino | 437/198 |
| 4,931,410 | 6/1990 | Tokunaga et al. | 437/189 |
| 5,084,412 | 1/1992 | Nakasaki | 437/189 |
| 5,447,599 | 9/1995 | Li et al. | 216/17 |
| 5,447,887 | 9/1995 | Filipiak et al. | 437/200 |
| 5,612,254 | 3/1997 | Mu et al. | 437/195 |
| 5,904,565 | 5/1999 | Nguyen et al. | 438/687 |
| 6,066,560 | 5/2000 | Yakura | 438/687 |
| 6,071,813 | 6/2000 | Nogami | 438/687 |
| 6,080,655 | 6/2000 | Givens et al. | 438/626 |
| 6,083,822 | 7/2000 | Lee | 438/624 |

*Primary Examiner*—Donald L. Monin, Jr.
*Assistant Examiner*—Ginette Peralta
*Attorney, Agent, or Firm*—George O. Saile; Rosemary L. S. Pike; Graham S. Jones, II

[57] ABSTRACT

A structure and method for making copper interconnections in an integrated circuit are described. The structure is a damascene copper connector whose upper surface is coplanar with the upper surface of the insulating layer in which it is embedded. Out-diffusion of copper from the connector is prevented by two barrier layers. One is located at the interface between the connector and the insulating layer while the second barrier is an insulating layer which covers the upper surface of the connector. The damascene process involves filling a trench in the surface of the insulator with copper and then removing the excess by chem.-mech. polishing. Since photoresist is never in direct contact with the copper the problem of copper oxidation during resist ashing has been effectively eliminated.

27 Claims, 2 Drawing Sheets

DAMASCENE PROCESS FOR FORMING COPLANAR TOP SURFACE OF COPPER CONNECTOR ISOLATED BY BARRIER LAYERS IN AN INSULATING LAYER

This is a continuation of U.S. patent application Ser. No. 08/876,915 filed Jun. 16, 1997, now U.S. Pat. No. 5,900,672; which was a division of U.S. patent application Ser. No. 630,709 filed Apr. 8, 1996, now U.S. Pat. No. 5,744,376.

BACKGROUND OF THE INVENTION (1) Field of the Invention

The invention relates to the general field of integrated circuits, more particularly to the design and use of copper interconnections therein.

(2) Description of the Prior Art

As wire widths in integrated circuits continue to shrink, the electrical conductivity of the wiring material itself becomes increasingly more important. Thus, in this regard, aluminum, which has been the material of choice since the integrated circuit art began, is becoming less attractive than other better conductors such as copper, gold, and silver. These materials, in addition to their superior electrical conductivity, are also more resistant than aluminum to electromigration, a quality that grows in importance as wire widths decrease.

The metals in question have not been widely used for wiring as yet because they also suffer from a number of disadvantages, including formation of undesirable intermetallic alloys and/or recombination centers in other parts of the integrated circuit and they often have high diffusion rates. Copper has the additional disadvantage of being readily oxidized at relatively low temperatures. Nevertheless, copper is seen as an attractive replacement for aluminum because of its low cost and ease of processing so that the prior and current art has tended to concentrate on finding ways to overcome these limitations.

A particular problem related to copper's high susceptibility to oxidation is that conventional photoresist processing cannot be used when the copper is to be patterned into various wire shapes because the photoresist needs to be removed at the end of the process by heating it in a highly oxidizing environment, such as an oxygen plasma, thereby converting it to an easily removed ash.

Several solutions to the above problems associated with copper processing have been proposed in the prior art. Hoshino (U.S. Pat. No. 4,910,169 March 1990) teaches the use of low temperature deposition techniques, such as RF sputtering, for coating copper layers with materials such as silicon oxide, silicon nitride, and phosphosilicate glass. It should be noted that the materials mentioned were for the purpose of forming inter-metal dielectric layers rather than for use as barrier layers, implying that they were relatively thick.

Li et al. (U.S. Pat. No. 5,447,599 September 1995) use TiN(O) as a barrier layer material for copper. The copper is initially coated with a layer of titanium and a copper-titanium alloy is formed by heating at 3–400° C. Unreacted titanium is then removed and the alloy is transformed to TiN(O) by means of a rapid thermal anneal in ammonia and oxygen.

Nakasaki (U.S. Pat. No. 5,084,412 January 1992) underlays the copper layer with a metallic nitride and then heats the combination in nitrogen to bring about grain boundary diffusion of the nitrogen into the copper. This results in a material having relatively low electrical resistivity together with good resistance to electromigration.

Tokunaga et al. (U.S. Pat. No. 4,931,410 June 1990) use photoresist for shaping their copper but first protect it with an antioxidizing layer. Etching is then performed in two steps first the anti-oxidizing layer is etched in conventional fashion, including photoresist removal, following which said antioxidizing layer is used as the mask for the etching of the copper.

Filipiak et al. (U.S. Pat. No. 5,447,887 September 1995) use an intermediate layer of copper silicide to improve the adhesion between a copper layer and a silicon nitride layer.

It should be noted that none of the above-cited examples of the prior art is based on a damascene process nor do they incorporate more than a single barrier layer in their structures or processes. The term 'damascene' is derived from a form of inlaid metal jewelery first seen in the city of Damascus. In the context of integrated circuits it implies a patterned layer imbedded on and in another layer such that the top surfaces of the two layers are coplanar.

SUMMARY OF THE INVENTION

It has been an object of the present invention to provide a copper connector in an integrated circuit.

A further object of the present invention has been to provide means for preventing the outdiffusion of copper from said connector into adjoining layers.

Yet another object of the present invention has been to provide a method for manufacturing said copper connector that does not expose the copper to the possibility of being oxidized during processing.

A still further object of the present invention has been to provide a method for manufacturing said copper connector without having a layer of photoresist in contact with the copper at any time.

These objects have been achieved by providing a damascene copper connector whose upper surface is coplanar with the upper surface of the insulating layer in which it is embedded. Out-diffusion of copper from the connector is prevented by two barrier layers. One is located at the interface between the connector and the insulating layer while the second barrier is an insulating layer which covers the upper surface of the connector. The damascene process involves filling a trench in the surface of the insulator with copper and then removing the excess by chem.mech. polishing. Since photoresist is never in direct contact with the copper the problem of copper oxidation during resist ashing has been effectively eliminated.

DESCRIPTION OF THE PREFERRED EMBODIMENTS

A more detailed description of the structure that comprises the present invention will be given below. First, however, it is important to describe the basic nature of said structure as well as the motives behind its development. As already noted, copper is easily oxidized at relatively low temperatures and copper is known to diffuse rapidly through certain dielectric materials, such as silicon oxide, that are widely used in the integrated circuit art. Also as noted, the oxidation problem of copper makes it impossible to use conventional ashing techniques for the removal of used photoresist in the presence of copper.

To overcome the photoresist removal problem, the present invention uses a damascene technique for forming the copper interconnection pattern, thereby eliminating the need for ashing photoresist in the presence of copper. To overcome this diffusion problem, the present invention provides for a second barrier layer in addition to the barrier layer already known to the prior art. Because the damascene process was used to shape the copper, the second barrier layer lies on a planar surface, making it more effective (for a given thickness) than is the case in a conventional structure of the prior art.

Figure 1:
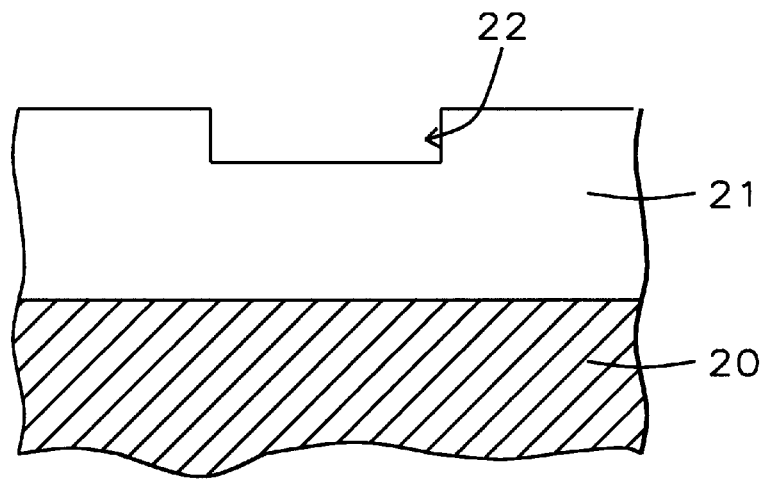
FIG. 1 shows the starting point of a process for the manufacture of the present invention.

Referring now to FIG. 1, the process for manufacturing the present invention begins with the provision of silicon substrate 20. It is assumed that substrate 20 has already been subjected to a variety of processes associated with the formation of integrated circuits but this is not shown in the figure. Insulating layer 21, consisting of silicon oxide, polyimide, or any similar low dielectric constant material, is then deposited to a thickness between about 5,000 and 20,000 Angstroms (0.5. and 2 microns) microns onto substrate 20 by chemical vapor deposition (CVD), physical vapor deposition (PVD) or spin coating. The insulating layer 21 has a top surface and a bottom surface. Layer 21 is then patterned and etched to form trench 22 in its upper surface. Our preferred method for forming the trench has been dry plasma etching but any similar method, such as wet etching, may be used. The trench 22 has walls and a bottom. The bottom of the trench 22 is located above the bottom surface of the insulating layer 21. Typically, the depth of the trench has been between about 4,000 and 12,000 Angstroms, leaving a separation distance between the bottom of the trench and the bottom surface of layer 21 of between about 4,000 and 8,000 Angstroms.

Figure 2:
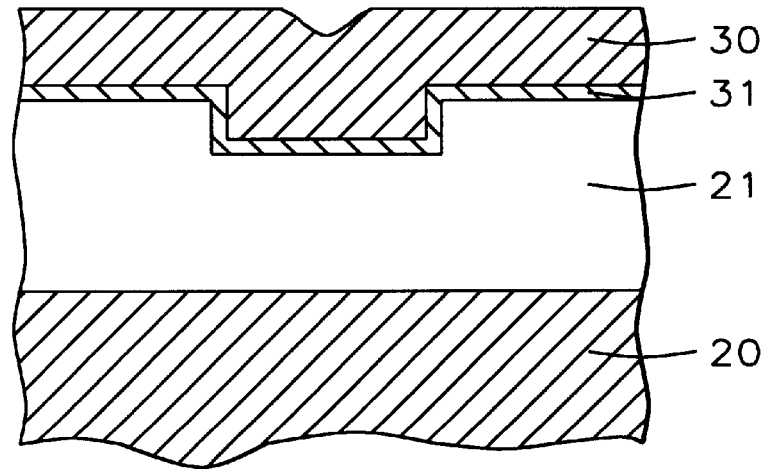
FIG. 2 shows an intermediate step in the manufacturing process.

Referring now to FIG. 2, barrier layer 31, comprising titanium nitride, tungsten nitride, titanium tungstide, or tantalum nitride, is now deposited over layer 21, including all walls of trench 22 and the bottom of trench 22, to a thickness between about 200 and 2,000 Angstroms. Thus, the first barrier layer 31 is thin with relative to the depth of the trench 22 as well as the width of trench 22. This is followed by the deposition of copper layer 30 to a depth sufficient to ensure that all parts of trench 22 are filled with copper as well as those parts of barrier layer 31 that lie outside trench 22. Our preferred method for depositing copper has been CVD, but any similar method such as PVD or electroplating could have been used. An optional copper reflow step may be added following copper deposition.

Figure 3:
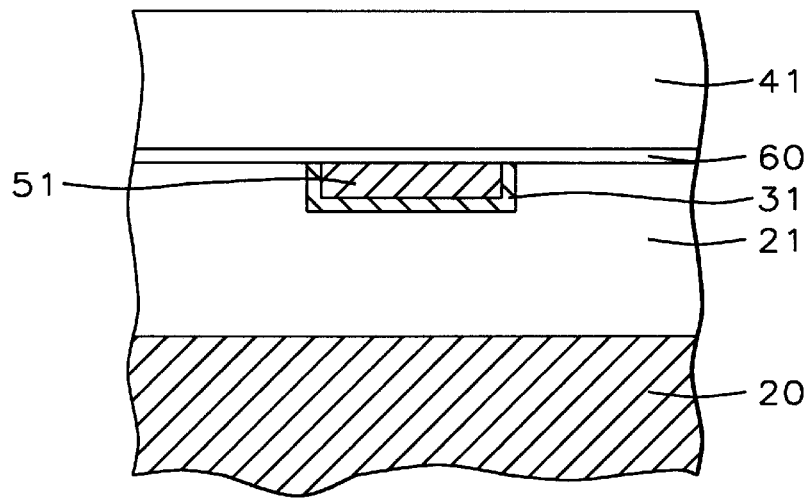
FIG. 3 shows a preferred embodiment of the present invention obtained at the completion of said manufacturing process.

Referring now to FIG. 3, excess copper, above the level of the top of the trench 22, is now removed together with those parts of barrier layer 31 that lie outside the trench 22, planarizing the top surface of the structure by making the copper layer 30 coplanar with the insulating layer 21. In other words, this results in the formation of damascene connector 51, as shown. Our preferred method for removing the excess copper from layer 30 has been chemical-mechanical polishing but any equivalent method such as blanket etch-back in a chlorine plasma at high temperature could have been used. Second barrier layer 60, comprising an insulating material such as aluminum oxide, tantalum oxide, or silicon nitride is now deposited over layer 21, as well as the exposed surface of demascene connector 51, to a thickness between about 200 and 2,000 Angstroms by CVD or PVD. This is followed by the deposition of insulating layer 41, comprising silicon oxide, polyimide, or similar low dielectric constant material to a thickness between about 0.5 and 2 microns.

FIG. 3 illustrates a preferred embodiment of the structural aspects of the present invention. As can be seen, it comprises damascene copper connector 51 that serves as a wiring connector, being located at the interface between two insulating layers 21 and 41. Outdiffusion of copper from connector 51 into either of layers 21 or 41 is prevented by the presence of the two barrier layers 31 and 60. The former is conventional and well known whereas the latter is believed to be novel.

Figure 4:
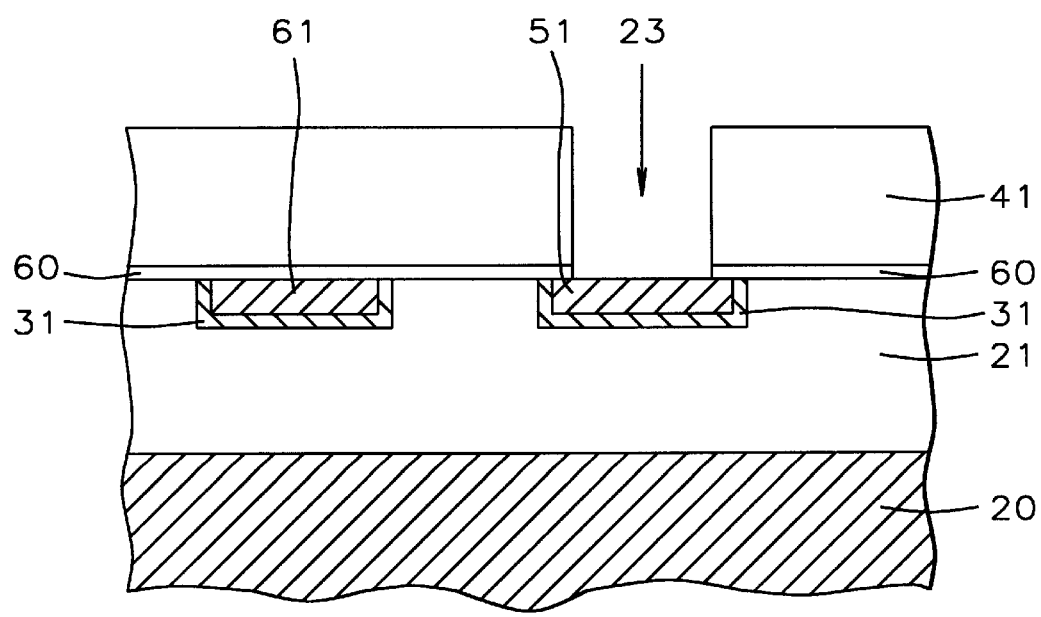
FIG. 4 shows additional details related to the application of the present invention.

In practice, connector 51 will need to be accessed through via holes passing through layers 41 and 60. This is illustrated in FIG. 4 where via 23 is seen to have been etched through layers 41 and 60 down to the top surface of copper damascene connector 51. Our preferred method for etching such via holes has been plasma dry etching but any similar method such as wet chemical etching may be used. An adjoining damascene connector 61 is shown in FIG. 4 to illustrate that second barrier layer 60 serves to protect both it and connector 51. This also means that layer 60 must comprise an insulating material to avoid the formation of short circuits between the different connectors that it protects.

While the invention has been particularly shown and described with reference to the preferred embodiments thereof, it will be understood by those skilled in the art that various changes in form and details may be made without departing from the spirit and scope of the invention.

What is claimed is:

1. A method of forming an electrical connector in an integrated circuit comprising:

forming a first insulating layer, having a top surface and a bottom surface on a silicon substrate, forming a trench in said first insulating layer, said trench having walls and a bottom, said bottom of said trench being a distance above said bottom surface of said first insulating layer, forming a barrier layer covering said bottom of said walls and said bottom surface of said trench, forming a copper connector over said barrier layer in said trench, said copper connector having upper and lower surfaces, such that the upper surface of said copper connector is at the level of said upper surface of said first insulating layer and said lower surface of said copper connector is said distance above the bottom surface of said first insulating layer plus the thickness of said barrier layer, forming a second, insulating, barrier layer on said upper surface of said copper connector and forming said second, insulating, barrier layer on said top surface of said first insulating layer aside from said copper connector, and forming a second insulating layer on said second barrier layer, whereby said first barrier layer forms a first interface is formed between said copper connector and said first insulating layer.

2. The method of claim 1 wherein:

said bottom of said trench and said bottom of said first insulating layer have a separation distance of between about 4,000 Å and about 8,000 Å.

3. The method of claim 1 wherein:

said first insulating layer is deposited to a thickness between about 5,000 Å and about 20,000 Å, the depth of said trench is between about 4,000 Å and 12,000 Å, and said bottom of said trench and said bottom of said first insulating layer having a separation distance of between about 4,000 Å and about 8,000 Å.

4. The method of claim wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said second barrier layer comprises material selected from the group consisting of aluminum oxide, tantalum oxide and silicon nitride deposited layer by a method selected from chemical vapor deposition and physical vapor deposition, and said first barrier layer and said second barrier layer are deposited to a thickness between about 200 Å and about 2,000 Å, said copper layer is deposited by a method selected from chemical vapor deposition, physical vapor deposition, and electroplating, said copper layer is removed by a method selected from chemical-mechanical polishing and a blanket etch-back, said trench is etched by plasma dry etching, said via is etched by plasma dry etching, and said second insulating layer comprises a material selected from the group consisting of silicon oxide and polyimide deposited to a thickness between about 5,000 Å and about 20,000 Å.

5. A method for manufacturing a copper connector in an integrated circuit comprising:

(a) providing a silicon substrate, (b) depositing a first insulating layer on said silicon substrate to a predetermined thickness, said first insulating layer having a top surface and a bottom surface, (c) patterning and then etching to form a trench with an open top, walls on the sides, and a bottom of said trench in said first insulating layer extending to a depth less than said predetermined thickness, said bottom of said trench being above said bottom surface of said first insulating layer leaving a separation distance between said bottom of said trench and said bottom surface, (d) depositing a first barrier layer on said top surface of said first insulating layer and on all walls of said trench and said bottom of said trench, (e) depositing a copper layer on said first barrier layer so as to more than fill said trench, (f) removing said copper layer and said first barrier layer down to the level of said first insulating layer, thereby forming a damascene connector having an upper surface, (g) depositing a second barrier layer on said first insulating layer and said upper surface of said damascene connector, and (h) depositing a second insulating layer on said second barrier layer.

6. The method of claim 5 comprising:

(i) patterning and then etching said second insulating layer to form a via passing through said second insulating layer and said second barrier layer to said upper surface of said damascene connector.

7. The method of claim 6 wherein said via is etched by plasma dry etching.

8. The method of claim 5 wherein said first insulating layer comprises a material selected from the group consisting of silicon oxide and polyimide.

9. The method of claim 5 wherein:

said first insulating layer is deposited to a thickness between about 5,000 Å and about 20,000 Å, said trench has a depth between about 4,000 Å and 12,000 Å, and said bottom of said trench and said bottom of said first insulating layer have a separation distance of between about 4,000 Å and about 8,000 Å.

10. The method of claim 5 wherein said first barrier layer comprises material selected from the group consisting of titanium nitride, tungsten nitride, titanium tungstide, and tantalum nitride and said first barrier layer is deposited to a thickness between about 200 Å and about 2,000 Å.

11. The method of claim 5 wherein said copper layer is deposited by a method selected from chemical vapor deposition, physical vapor deposition, and electroplating.

12. The method of claim 10 wherein said copper layer is removed down to the level of said first insulating layer by chemical-mechanical polishing, and blanket etch-back.

13. The method of claim 5 wherein said trench is etched by plasma dry etching.

14. The method of claim 5 wherein:

said second insulating layer comprises a material selected from the group consisting of silicon oxide and polyimide, said second insulating layer is deposited to a thickness between about 5,000 Å and about 20,000 Å, and said bottom of said trench and said bottom of said first insulating layer have a separation distance of between about 4,000 Å and about 8,000 Å.

15. The method of claim 5 wherein said second barrier layer comprises material selected from the group consisting of aluminum oxide, tantalum oxide and silicon nitride.

16. The method of claim 15 wherein step (g) further comprises depositing the second barrier layer by chemical vapor deposition, physical vapor deposition.

17. The method of claim 5 wherein said first insulating layer comprises a material selected from the group consisting of silicon oxide and polyimide deposited to a thickness between about 5,000 Å and about 20,000 Å.

18. The method of claim 5 wherein:

said first insulating layer comprises a material selected from the group consisting of a material selected from the group consisting of silicon oxide and polyimide deposited to a thickness between about 5,000 Å and about 20,000 Å, the depth of said trench is between about 4,000 Å and 12,000 Å, and said bottom of said trench and said bottom of said first insulating layer have a separation distance of between about 4,000 Å and about 8,000 Å.

19. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, and said second barrier layer comprises material selected from the group consisting of aluminum oxide, tantalum oxide and silicon nitride.

20. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said second barrier layer comprises material selected from the group consisting of aluminum oxide, tantalum oxide and silicon nitride, and said first barrier layer is deposited to a thickness between about 200 Å and about 2,000 Å.

21. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said first barrier layer is deposited to a thickness between about 200 Å and about 2,000 Å, said bottom of said trench and said bottom of said first insulating layer have a separation distance of between about 4,000 Å and about 8,000 Å, said second barrier layer comprises material selected from the group consisting of aluminum oxide, tantalum oxide and silicon nitride, said first barrier layer and said second barrier layer are deposited to a thickness between about 200 Å and about 2,000 Å, and said copper layer is deposited by a method selected from chemical vapor deposition, physical vapor deposition, and electroplating.

22. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said first barrier layer is deposited to a thickness between about 200 Å and about 2,000 Å said second barrier layer comprises material selected from the group consisting of aluminum oxide, tantalum oxide and silicon nitride, said first barrier layer and said second barrier layer are deposited to a thickness between about 200 Å and about 2,000 Å, said copper layer is deposited by a method selected from chemical vapor deposition, physical vapor deposition, and electroplating, and said copper layer is removed down to the level of said first insulating layer by chemical-mechanical polishing, and blanket etch-back.

23. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said second barrier layer comprises material selected from the group consisting of aluminum oxide, tantalum oxide and silicon nitride, said first barrier layer and said second barrier layer are deposited to a thickness between about 200 Å and about 2,000 Å, said copper layer is deposited by a method selected from chemical vapor deposition, physical vapor deposition, and electroplating, said copper layer is removed by a method selected from chemical-mechanical polishing and a blanket etch-back, and said trench is etched by plasma dry etching.

24. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said second barrier layer comprises material selected from the group consisting of aluminum oxide, tantalum oxide and silicon nitride, said first barrier layer and said second barrier layer are deposited to a thickness between about 200 Å and about 2,000 Å, said copper layer is deposited by a method selected from chemical vapor deposition, physical vapor deposition, and electroplating, and said copper layer is removed by a method selected from chemical-mechanical polishing and a blanket etch-back.

25. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said second barrier layer comprises material selected from the group consisting of aluminum oxide, tantalum oxide and silicon nitride, said first barrier layer and said second barrier layer are deposited to a thickness between about 200 Å and about 2,000 Å, said bottom of said trench and said bottom of said first insulating layer have a separation distance of between about 4,000 Å and about 8,000 Å, said copper layer is deposited by a method selected from chemical vapor deposition, physical vapor deposition, and electroplating, said copper layer is removed by a method selected from chemical-mechanical polishing and a blanket etch-back, said trench is etched by plasma dry etching, and said via is etched by plasma dry etching.

26. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said second barrier layer comprises material selected from the group consisting of aluminum oxide, tantalum oxide and silicon nitride, said first barrier layer and said second barrier layer are deposited to a thickness between about 200 Å and about 2,000 Å, said bottom of said trench and said bottom of said first insulating layer have a separation distance of between about 4,000 Å and about 8,000 Å, said copper layer is deposited by a method selected from chemical vapor deposition, physical vapor deposition, and electroplating, said copper layer is removed by a method selected from chemical-mechanical polishing and a blanket etch-back, said trench is etched by plasma dry etching, said via is etched by plasma dry etching, and said second insulating layer comprises a material selected from the group consisting of silicon oxide and polyimide deposited to a thickness between about 5,000 Å and about 20,000 Å.

27. The method of claim 5 wherein:

said first insulating layer comprises a material selected from the group consisting of silicon oxide and polyimide deposited to a thickness between about 5,000 Å and about 20,000 Å, the depth of said trench is between about 4,000 Å and 12,000 Å, said bottom of said trench and said bottom of said first insulating layer have a separation distance of between about 4,000 Å and about 8,000 Å, said first barrier layer comprises material selected from the group consisting of titanium nitride, tungsten nitride, titanium tungstide, and tantalum nitride, said second barrier layer comprises material selected from the group consisting of aluminum oxide, tantalum oxide and silicon nitride, said first barrier layer and said second barrier layer are deposited to a thickness between about 200 Å and about 2,000 Å, said bottom of said trench and said bottom of said first insulating layer have a separation distance of between about 4,000 Å and about 8,000 Å, said copper layer is deposited by a method selected from chemical vapor deposition, physical vapor deposition, and electroplating, said copper layer is removed by a method selected from chemical-mechanical polishing and a blanket etch-back, said trench is etched by plasma dry etching, said via is etched by plasma dry etching, said second insulating layer comprises a material selected from the group consisting of silicon oxide and polyimide deposited to a thickness between about 5,000 Å and about 20,000 Å, and step (g) further comprises depositing the second barrier layer by a method selected from chemical vapor deposition and physical vapor deposition.

* * * * *